United States Patent [19]
Rife et al.

[11] Patent Number: 5,945,736
[45] Date of Patent: Aug. 31, 1999

[54] HEAT SINK ASSEMBLY WITH SNAP-IN COVER PLATE HAVING MULTIPLE PRESSURE CAPABILITY

[75] Inventors: William B. Rife, Greenville; Kevin A. McCullough, North Kingstown, both of R.I.

[73] Assignee: Chip Coolers, Inc., Warwick, R.I.

[21] Appl. No.: 09/163,035

[22] Filed: Sep. 28, 1998

[51] Int. Cl.$^6$ ............ H01L 23/40; H01L 23/28; H01L 23/42
[52] U.S. Cl. ............ 257/719; 257/718; 257/726; 257/731; 257/727; 257/706
[58] Field of Search ............ 257/706, 712, 257/713, 717, 718, 719, 726, 727, 738, 737, 734, 731–733

[56] References Cited

U.S. PATENT DOCUMENTS

| | | | |
|---|---|---|---|
| Re. 35,573 | 7/1997 | Clemens | 257/719 |
| 2,916,159 | 12/1959 | O'Neill | 211/89 |
| 3,033,537 | 5/1962 | Brown, Jr. | 257/263 |
| 3,229,756 | 1/1966 | Keresztury | 165/67 |
| 4,345,267 | 8/1982 | Corman et al. | 357/81 |
| 4,607,685 | 8/1986 | Mitchell, Jr. | 165/80.3 |
| 4,660,123 | 4/1987 | Hermann | 361/386 |
| 4,745,456 | 5/1988 | Clemens | 357/79 |
| 5,313,099 | 5/1994 | Tata et al. | 257/717 |
| 5,375,652 | 12/1994 | Matsunaga et al. | 257/718 |
| 5,397,919 | 3/1995 | Tata et al. | 257/717 |
| 5,647,870 | 7/1997 | McCullough | 257/717 |
| 5,662,163 | 9/1997 | Mira | 257/718 |
| 5,706,171 | 1/1998 | Edwards et al. | 257/717 |
| 5,708,564 | 1/1998 | Lin | 361/704 |
| 5,789,813 | 8/1998 | Kirkland et al. | 257/738 |

FOREIGN PATENT DOCUMENTS

| | | | |
|---|---|---|---|
| 0130279A3 | 3/1984 | European Pat. Off. | H01L 23/40 |
| 29516627U1 | 12/1995 | Germany | H01L 23/40 |
| 58-176959 | 10/1983 | Japan | H01L 23/36 |

*Primary Examiner*—Alexander Oscar Williams
*Attorney, Agent, or Firm*—Barlow,Josephs & Holmes, Ltd

[57] ABSTRACT

A heat dissipating device which can provide multiple levels of pressure to a semiconductor package, having an outer peripheral ceramic region and an inner silicon region, is provided. A top cover member is provided with a central female-threaded bore. The top member is secured, without the use of tools, to the ceramic portion of the semiconductor package by a pair of upwardly standing legs with inwardly turned flanges where the flanges engage the marginal opposing portions of the top member. A heat dissipating member, having male-threaded base, is threadably inserted into the female-threaded bore to engage the upper surface of the silicon portion of the semiconductor package. The pressure of the heat dissipating member is independently adjustable, by hand, relative to the preset pressure of the top member onto the ceramic portion of the semiconductor package. As a result, the multiple pressure requirements of the semiconductor package can be accommodated in a single heat dissipating device without the need for tools.

13 Claims, 11 Drawing Sheets

HEAT SINK ASSEMBLY WITH SNAP-IN COVER PLATE HAVING MULTIPLE PRESSURE CAPABILITY

BACKGROUND OF THE INVENTION

The present invention relates generally to electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board, also known as a motherboard. These integrated circuit devices, particularly the CPU microprocessor chips, generate a great deal of heat during operation which must be removed to prevent adverse effects on operation of the system into which the device is installed. For example, a PENTIUM microprocessor containing millions of transistors is highly susceptible to overheating which could destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers. For example, many microprocessors manufactured by the Motorola Corporation, for use in Apple Corporation computers, employ BGA-type packages. Unlike a PENTIUM microprocessor with a PGA package, which has pins to be installed into a receiving socket, BGA and LGA semiconductor packages include an array of electrical contacts on their bottom surfaces to engage directly with an array of receiving electrical contacts on a circuit board, socket or the like. These semiconductor device packages have, in the past, been soldered directly to a circuit board or socket. However, such direct soldering makes replacement and/or upgrade of the semiconductor device package more difficult because it must be unsoldered from the board or socket for such replacement or upgrade.

To address the foregoing concerns, various sockets are being provided to receive, in temporary fashion, a BGA, LGA or similar surface mount semiconductor device package. In the event replacement or upgrade is required, the chip is simply removed from the socket and replaced with the new package. However, there are various concerns relating to the use of such BGA and LGA socket. For example, since no soldering is carried out in these new socket configurations, the solder balls of a BGA package and the contacts of an LGA must be maintained in electrical communication with the corresponding contact array on the socket. As a result, a minimum amount of pressure or force must be maintained on the semiconductor device package to maintain the electrical contact with the socket. It is not uncommon for the required minimum pressure to be in the vicinity of 50 psi (pounds per square inch) to maintain the electrical connection of the device package to the socket into which it is installed. If this pressure is not maintained, or is not consistent over the surface of the package, the electrical connection will fail.

Various efforts have been made to simply clamp the semiconductor device package, such as a BGA or LGA, to its corresponding socket by a top planar member with a series of screw fastening members sufficiently secured to attain the desired psi pressure on the package. However, BGA and LGA and similar packages commonly include a separate silicon portion containing the actual electronic components which is then subsequently mounted to a larger ceramic base. Since the silicon central pad is installed on the ceramic base, which contain the necessary interconnections for the package, the semiconductor device package is thicker at its central portion. Problems have arisen in connection with these BGA and LGA socket systems because at least 40 or 50 psi must be applied to the ceramic portion to maintain the socket interconnection; however, while the central silicon pad region would be crushed and/or damaged by such a force applied thereto. It is not uncommon for such a device package to have a minimum 50 psi requirement on the ceramic portion to maintain the electrical interconnection to the socket while having a maximum 10 psi requirement on the silicon portion to avoid damage thereto.

In similar fashion to the PENTIUM-type semiconductor devices discussed above, the BGA, LGA and related device packages also suffer from excessive generation of heat. If such heat is not properly dissipated, the chip will eventually fail. As a result, efforts have been made to supply a heat dissipating member, such as a heat sink, into thermal communication with the silicon portion of the semiconductor device package, such as a BGA or LGA chip. As a result of the competing needs for heat dissipation and pressure to maintain the socket connection, problems arise. In particular, simple clamping of a heat sink member to the top portion of a BGA socket must be maintained at a pressure sufficient to maintain the electrical interconnections to the socket; however, such a high pressure creates a risk of damage to the silicon portion of the package.

In view of the foregoing, there is a demand for a heat sink assembly which can simultaneously provide the requisite high pressure for maintaining a semiconductor device package in electrical interconnection with its corresponding socket while simultaneously providing a heat sink member in flush thermal communication with the silicon portion of a package at a second pressure much lower than the pressure being simultaneously applied to the ceramic portion of the semiconductor device package. In addition, there is a demand for a heat sink assembly that can independently adjust the pressure applied to the outer ceramic portion of a packet while permitting custom adjustment of the pressure of a heat sink applied to the silicon portion of the same semiconductor device package.

SUMMARY OF THE INVENTION

The present invention preserves the advantages of prior art heat sink assemblies for integrated circuit devices, such as microprocessors. In addition, it provides new advantages not found in currently available assemblies and overcomes many disadvantages of such currently available assemblies.

The invention is generally directed to the novel and unique heat sink assembly with particular application in cooling microprocessor integrated circuit devices, such as a ball grid array (BGA) and land grid array (LGA) semiconductor device packages. The heat sink assembly of the present invention enables the simple, easy and inexpensive assembly, use and maintenance of a heat sink assembly while realizing superior heat dissipation.

The preferred embodiment of the heat dissipating device of the present invention includes a semiconductor socket with a number of electrical contact seats. A semiconductor package is installed in the socket where the semiconductor package has a lower surface with electrical contacts thereon. The electrical contacts are in electrical communication with the semiconductor socket and the semiconductor package includes an outer peripheral region defining a first thickness of the semiconductor package and a first upper surface and an inner pad region defining a second thickness of the semiconductor package, which is larger than said first thickness, and a second upper surface. A top cover member with a peripheral edge and a bottom surface is also provided where the top cover member defines a female threaded bore therethrough. The bottom surface of the top cover member is in communication with the first upper surface of the semiconductor package at the outer peripheral region.

In addition, a heat dissipating member is provided, with a threaded base portion with a substantially flat bottom surface adapted to be threadably received in the female threaded bore through the top cover member into communication with the second upper surface of the semiconductor package at the inner pad region; the heat dissipating member, and threaded routing into said threaded bore, defines an inner pad region pressure onto said second surface of the semiconductor package.

A pair of upstanding legs are provided with inwardly turned flanges which communicate with respective opposing marginal portions of the top cover member to maintain the top cover member in a predetermined pressure communication with the first upper surface of the semiconductor package. The upwardly standing legs and associated inwardly turned flanges define an outer peripheral region pressure to be imparted on the first upper surface of the semiconductor package by the bottom surface of the top cover member.

As a result, the outer peripheral region pressure and the inner pad region pressure are independently adjustable, by hand and without the use of tools, to enable different pressures to be applied to the first upper surface of the semiconductor package and the second upper surface of said semiconductor package, respectively.

In operation, the top plate of the present invention is placed over the socket or circuit board containing the receiving interconnection seat with the semiconductor device package disposed or sandwiched therebetween. The top cover member is snapped into place by hand to the engage the opposing upwardly standing legs. The upwardly standing legs are engaged with the top cover member in accordance with a predetermined pressure which is sufficient to maintain the device package and electrical interconnection with the socket. Typically, the interconnection is a separate socket which is commonly installed directly to a circuit board substrate. The central heat dissipating member is then threaded into the central bore of the top member with engagement of the male threaded shank to the female threads about the bore. The heat dissipating member is then threaded into the bore a distance sufficient to impart a predetermined pressure which is typically lower than the pressure required to maintain the package in electrical interconnection with the socket as held in place by the upwardly standing legs. As can be understood, the application to the outer peripheral ceramic of the packet can be applied separately and independently from the pressure applied to the central pad silicon portion of the package.

It is therefore an object of the present to provide a heat sink assembly which can accommodate a surface mount semiconductor device package.

Another object of the present invention is to provide a heat sink assembly with multiple pressure capability.

It is a further object of the present invention to provide a heat sink assembly which can provide a given pressure to the periphery of a semiconductor device package while simultaneously applying a relatively smaller pressure to the silicon portion of a semiconductor device package.

It is a further object of the present invention to provide a heat sink assembly which can provide independently adjustable pressure to the ceramic portion of a semiconductor device package and flush thermal communication at a second, lower pressure to the silicon portion of the package.

It is yet another object of the present invention to provide a heat sink assembly which can accommodate a wide array of surface mount semiconductor device packages which may be installed in a socket or directly to a circuit board.

A further object of the present invention is to provide two levels of pressure where the pressure applied to the ceramic portion of the semiconductor device package is preset.

Another object of the present invention is to provide a heat sink assembly which can be installed by hand and provide two levels of pressure without the need for tools.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
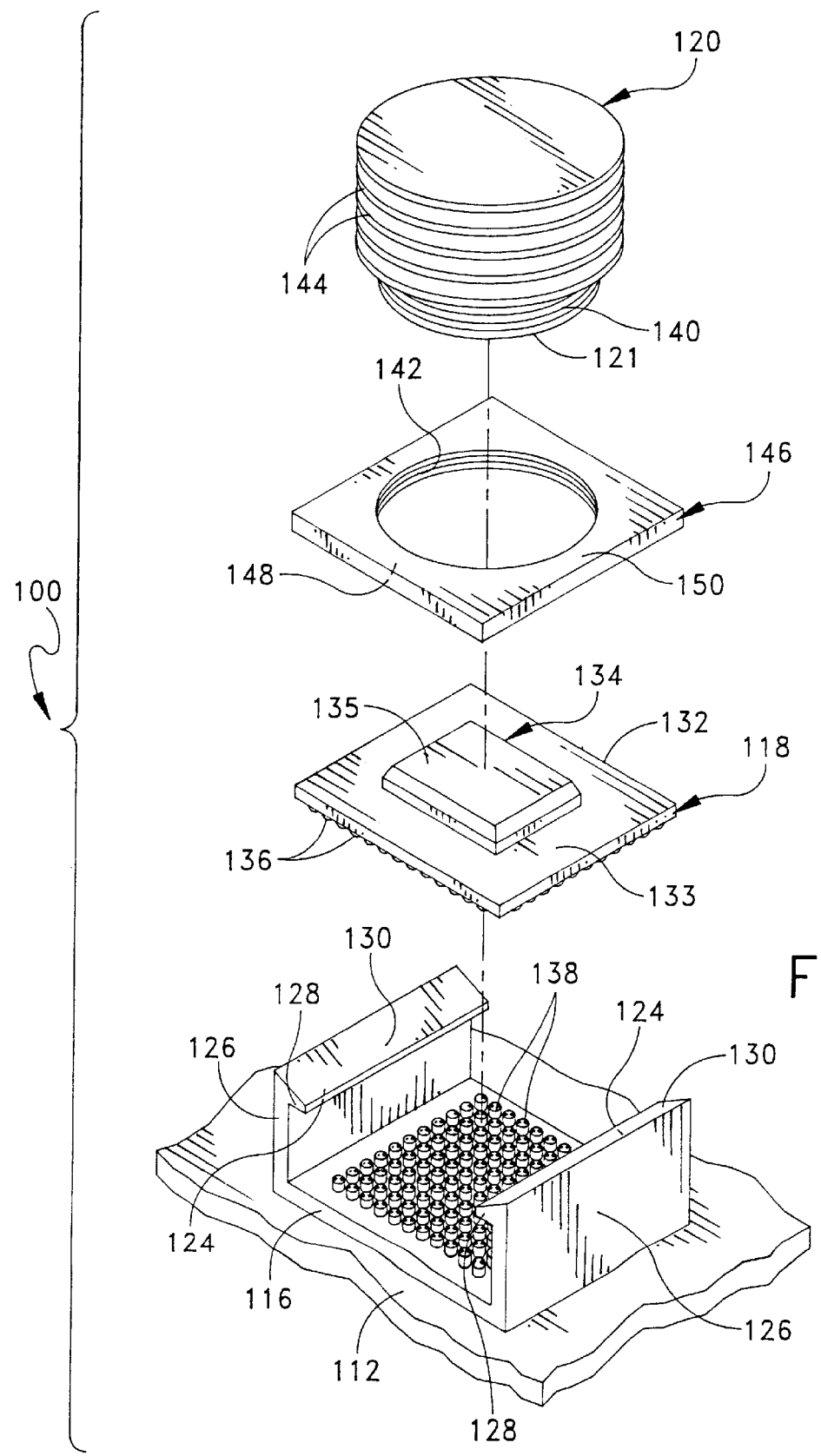
FIG. 1 is an exploded perspective view of the preferred embodiment of the heat sink assembly of the present invention.

Referring first to FIG. 1, the heat sink assembly 100 of the present invention is shown. It should be noted that the present invention provides a heat sink assembly for a BGA-type semiconductor device package. It should be understood that various other types of surface mount semiconductor packages may be employed within and accommodated by the present invention. Further, various types of socket and contact arrays may be employed and still be within the scope of the present invention. For ease of illustration, the following description relates to employment of the present invention for a BGA semiconductor device package. However, other types of packages, such as LGA packages, may also be easily accommodated by the heat sink assembly of the present invention.

Figure 2:
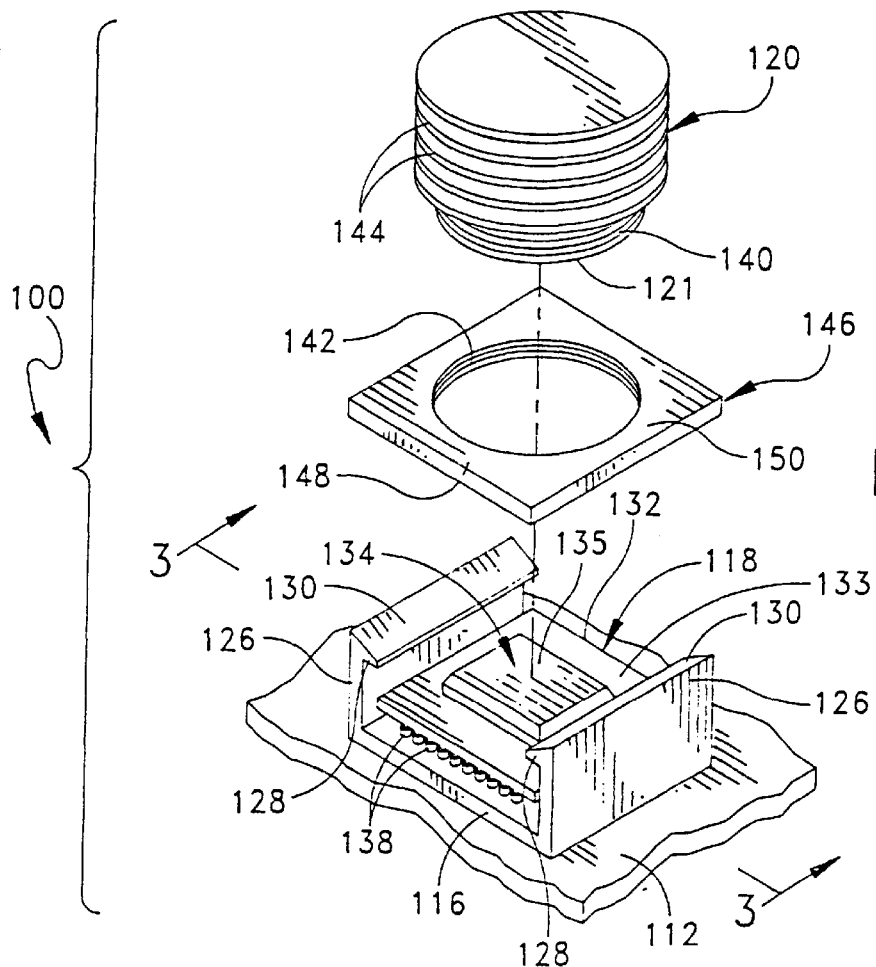
FIG. 2 is a partially assembled perspective view of the heat sink assembly of the present invention of FIG. 1.
Figure 3:
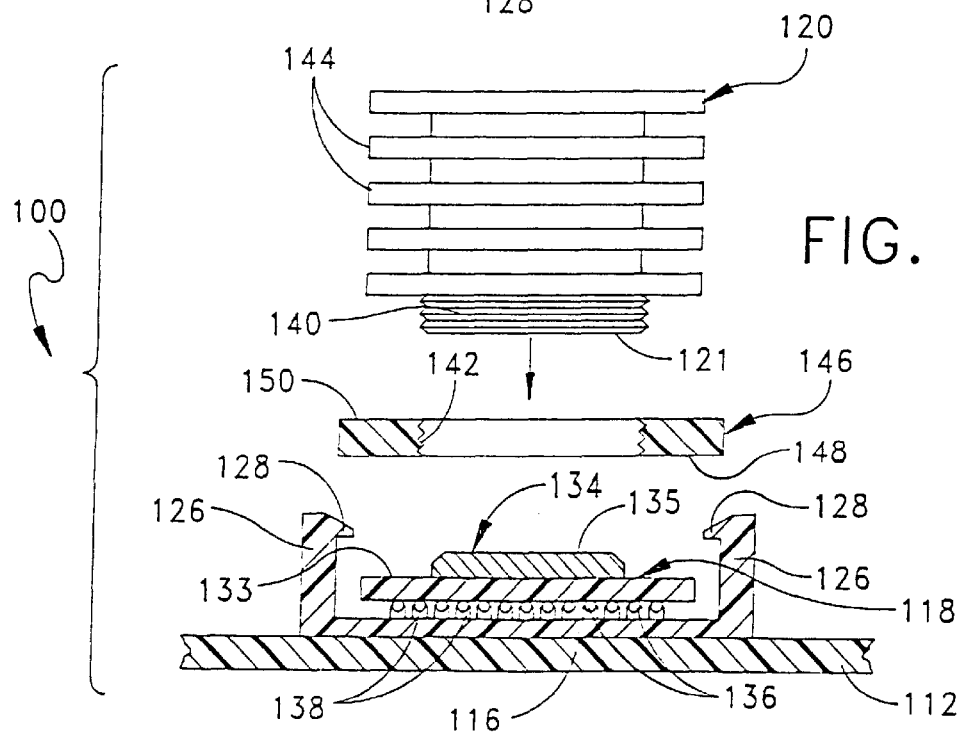
FIG. 3 is a partial cross-sectional view through the line 3—3 of FIG. 2.

Referring to FIGS. 1–3, the preferred embodiment of the present invention is shown. Circuit board 112 includes a semiconductor socket 116 which includes an array of contacts 138 which serve as BGA ball seats for engagement with BGA balls 136 on the underside of BGA semiconductor device package 118. As a result, contact array 138, via socket 116, serves as an interconnection for BGA semiconductor device 118 and the non-soldered engagement of balls 136 thereto to maintain electrical interconnection between BGA device 118 and circuit board 112.

In particular, BGA device 118 includes a ceramic portion 132 containing internal interconnections (not shown) from silicon portion 134 to BGA balls 136. BGA device 118 provides a top surface 133 of ceramic 132 as well as a second top surface 135 of silicon 134.

Disposed above BGA device 118 is a top cover plate 146 which includes a substantially central female threaded aperture 142. Female threaded aperture 142 is large enough to receive silicon portion 134 therein when bottom surface 148 of top cover plate 146 is in communication with top surface 133 of ceramic 132. Emanating upwardly from circuit board 112 are a pair of upstanding legs 126, each with an inwardly turned flange 128 and angled upper surface 130. Legs 126 are preferably integrated directly with socket 116 but may be separate members as discussed in connection with FIGS. 8 and 9 below. Each flange 128 includes a lower contact surface 124 for communicating with a peripheral region upper surface 150 of top cover plate 146. More specifically, flanges 128 engage with opposing edge portions of the top cover plate 146. The angled surfaces 130 facilitate the installation of top cover plate 146 as will be described in detail below.

Figure 4:
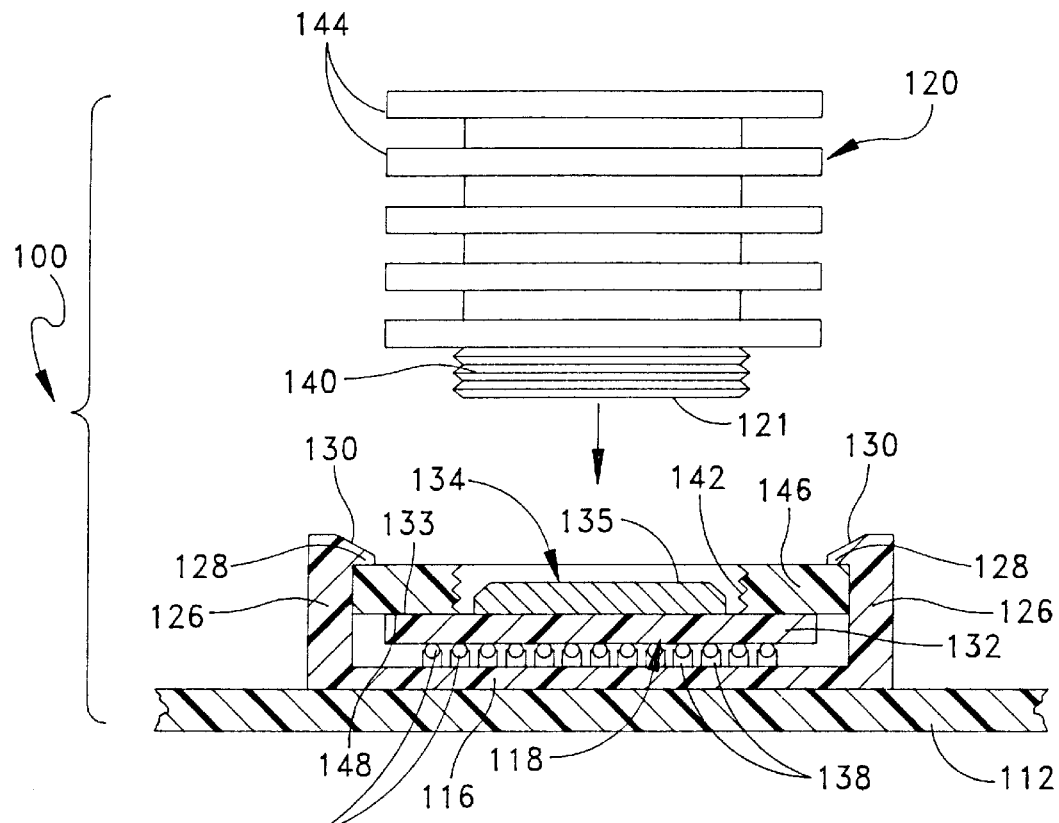
FIG. 4 is a partial cross-sectional view of the preferred embodiment of the present invention with top cover plate installed.
Figure 5:
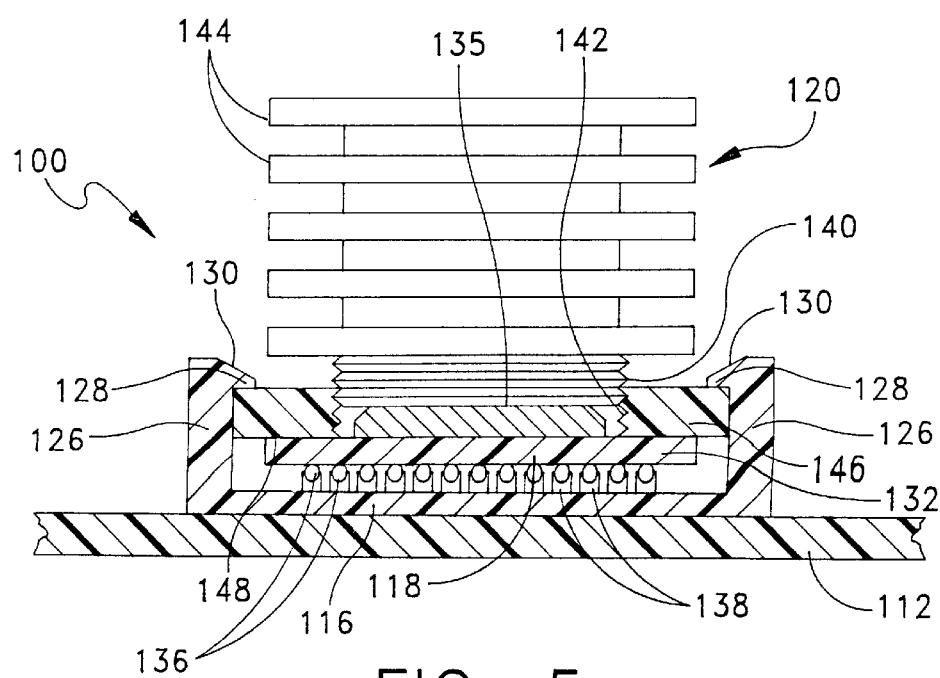
FIG. 5 is partial cross-sectional view of the preferred embodiment of the present invention in a fully assembled condition.

In FIGS. 4 and 5, the sandwiching of BGA device 118 between top cover plate 146 and socket 116 is shown. In FIGS. 4 and 5, the assembly and installation of the preferred embodiment of the heat sink assembly 100 of the present invention is also illustrated. Further, FIG. 4 illustrates a partially assembled cross-sectional view of FIG. 1 prior to the installation of heat dissipating member 120.

Still referring to FIG. 4, BGA device package 118 is installed onto its socket 116 so that solder balls 136 communicate with corresponding seats 138. Cover plate 146 is snapped onto the ceramic portion 132 of BGA device package 118, facilitated by angled surfaces 130 so that the bottom surface 148 of top cover plate 146 engages with the top surface 133 of ceramic portion 132 of BGA device package 118. Seats 138, ball contacts 136 and the BGA device package 118 itself provides a small degree of spring-biasing to permit top cover plate 146 to clear flanges 128. Top cover plate 146 is secured via engagement of its opposing edges with flanges 128. The distance of flanges 128 from BGA device package 118 when installed, will result in a predetermined pressure to be applied to the ceramic portion 132. This predetermined pressure applies the desired pressure to BGA device package 118 so that ball contacts 136 adequately form an electrical interconnection with contacts 138. The height and configuration of the legs 126 may be modified to select the appropriate pressure to be applied to the ceramic portion 132 of the BGA device package 118 at hand.

Once top cover plate 146 is secured in place at the desired pressure by flanges 128 of legs 126, heat dissipating member 120 can now be installed independently at a different pressure. As seen in FIG. 5, female threaded bore 132 is sufficiently large to permit BGA device 118 to reside completely therein. Male threaded base 140 is threadably inserted into female threaded aperture 142 so that bottom surface 121 of heat sink member 120 engages with top surface 135 of silicon portion 134 in complete flush thermal communication therewith. As shown in FIG. 5, heat dissipating member 120 is threadably installed to a desired tension and pressure. As discussed above, this pressure is preferably less than to the ceramic portion 132 because silicon portion 134 is much less tolerant to pressure and more easily damaged. In that connection, the pressure applied to the silicon portion 134 can be easily adjusted by threadably. turning heat dissipating member 120 to the desired tension. As a result, pressure to the ceramic 132 of BGA device 118 can be independently set from the pressure applied to the silicon portion 134 of BGA device 118.

Figure 6:
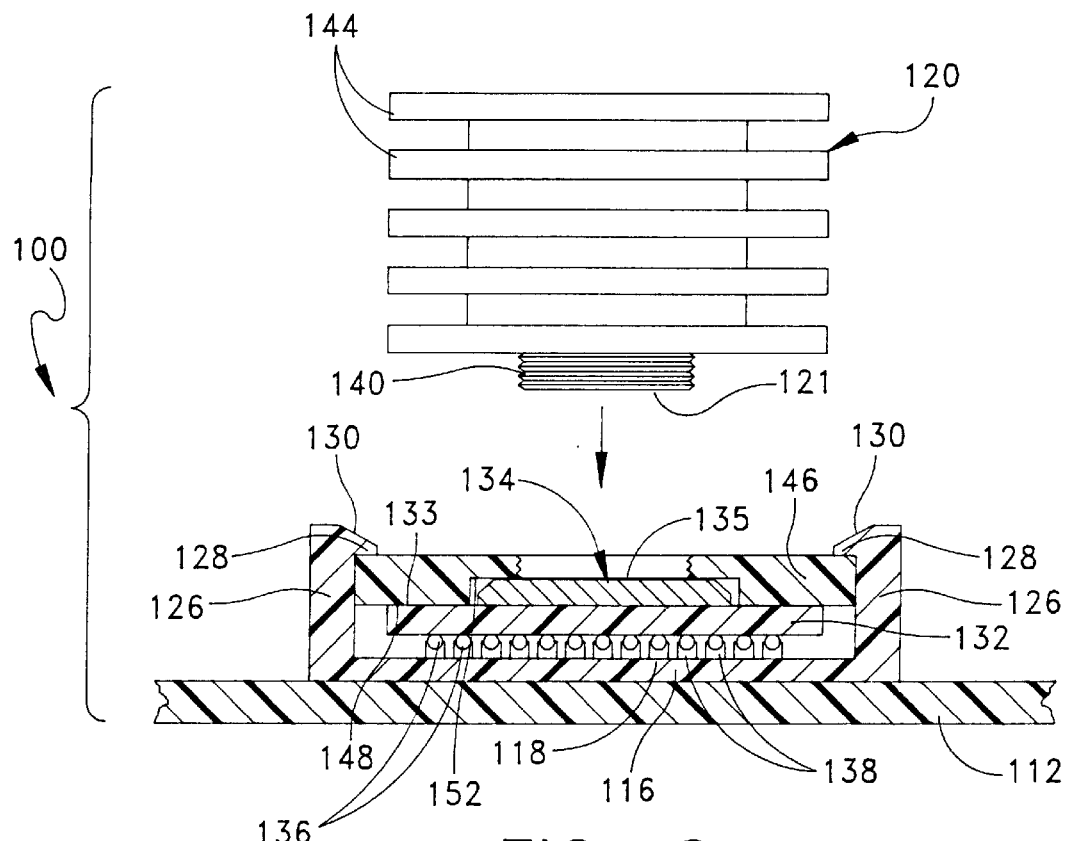
FIG. 6 is a partial cross-sectional view of the preferred embodiment of the present invention with a modified top cover plate.
Figure 7:
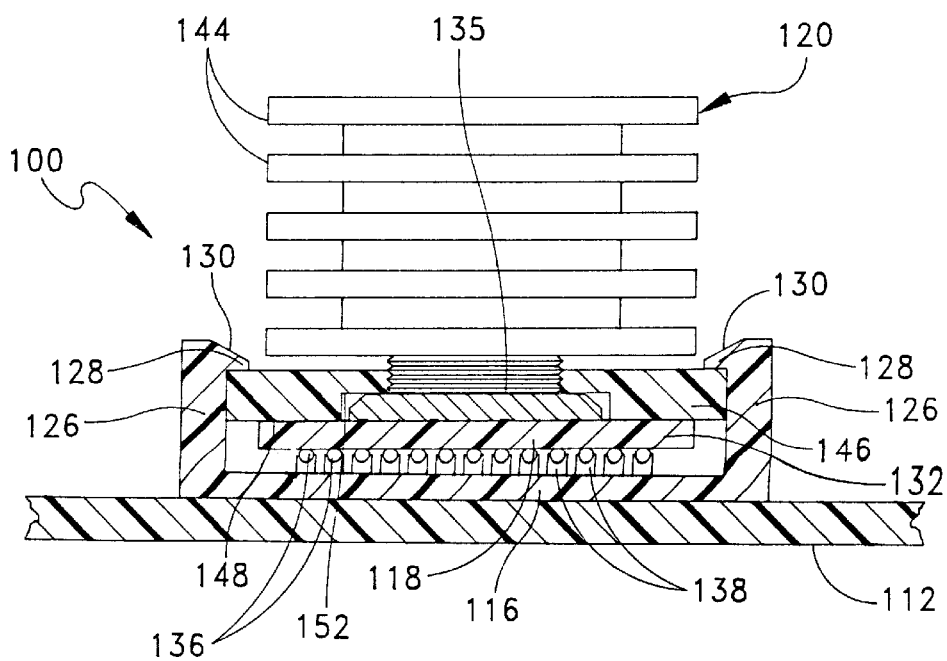
FIG. 7 is the cross-sectional view of FIG. 6 in a fully assembled condition.

Referring to FIGS. 6 and 7, the preferred embodiment of the present invention is shown to include a modified top cover plate 146. The heat sink assembly 100 of FIGS. 6 and 7 includes heat dissipating member 120 with radiating fins 144 and male threaded shank 140 which threadably engages with female threaded aperture 142. In contrast to the preferred embodiment shown in FIG. 1, the heat sink assembly of FIGS. 6 and 7 provides a seat 152 under the bottom surface of top cover plate 146 to receive and protect silicon portion 134 of BGA device 118. FIGS. 6 and 7 illustrate the multiple pressure capability of the present invention with the further employment of a thicker top cover plate 146 to further enable the use of a stronger top cover plate, for example. The heat sink assembly of FIGS. 6 and 7 further illustrates the flexibility of the assembly of the present invention to accommodate a wide range of semiconductor device packages and different socket configurations.

Figure 8:
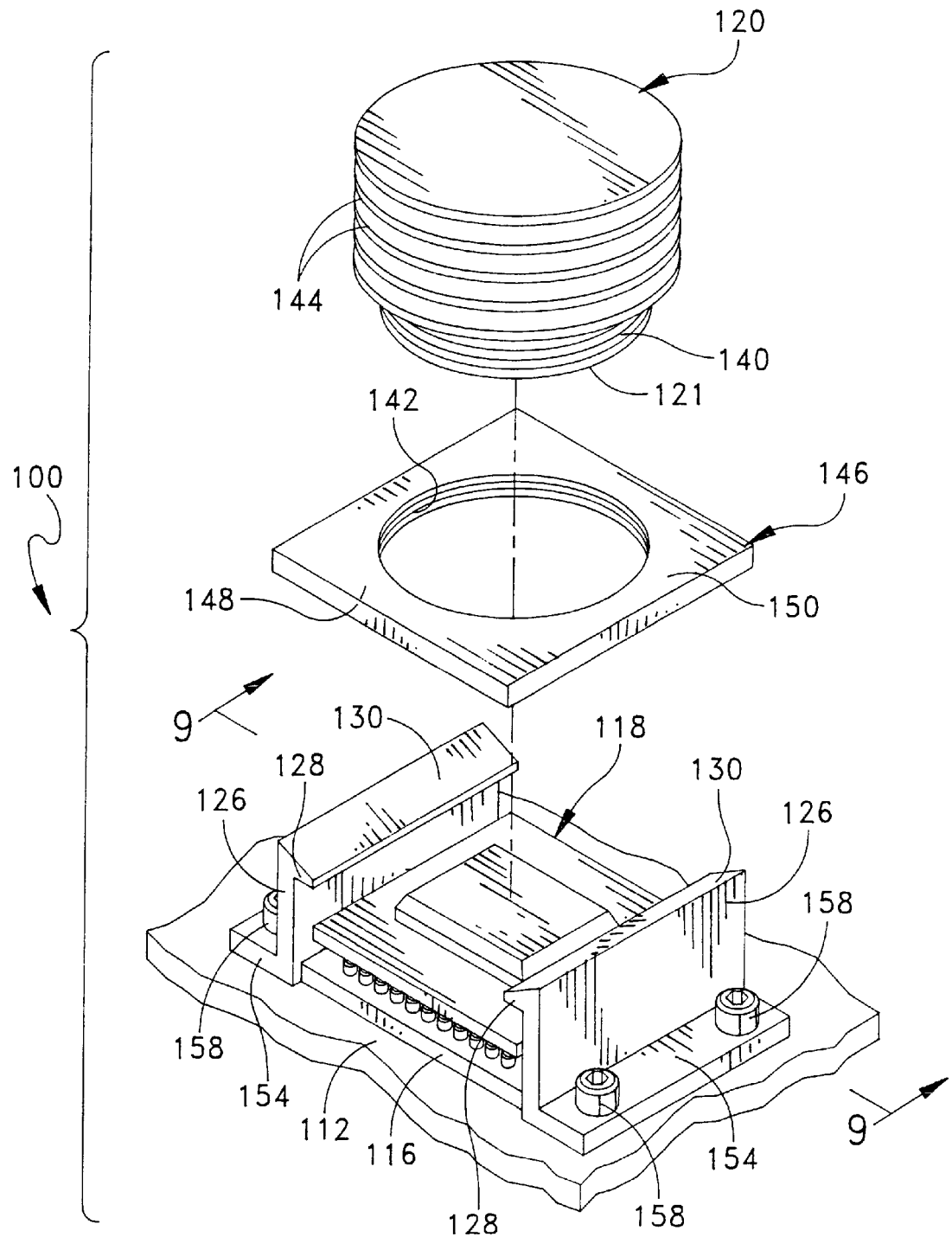
FIG. 8 is a partially exploded perspective view the preferred embodiment of the present invention with legs mounted directly to the circuit board.
Figure 9:
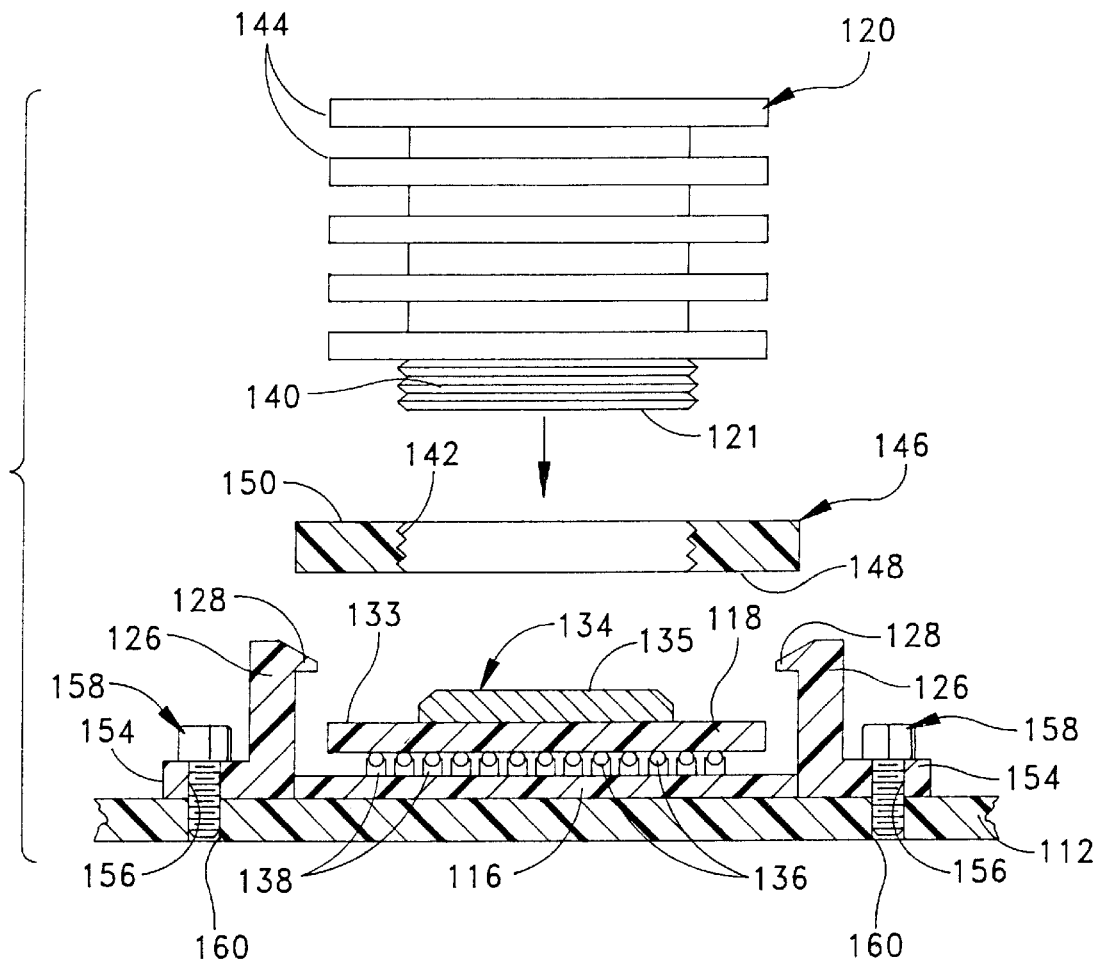
FIG. 9 is a partial cross-sectional view through the line 9—9 of FIG. 8.

Referring now to FIG. 8 and 9, the preferred embodiment of is shown with a slightly modified socket 116 and circuit board 112 arrangement to illustrate the mounting flexibility of the present invention. Legs 126 are upstanding members separate from socket 116 and are connected independently to circuit board 112 via fasteners 158. In FIGS. 8 and 9, fasteners 158 are routed through apertures 156 in a leg base 154 for connection to circuit board 112, namely receipt of fastener 156 by female threaded aperture 160. The foregoing illustrates that the particular configuration of the socket and circuit board is of little consequence as long as BGA device 118 is sandwiched between contact array 138 and top cover plate 146.

Figure 10:
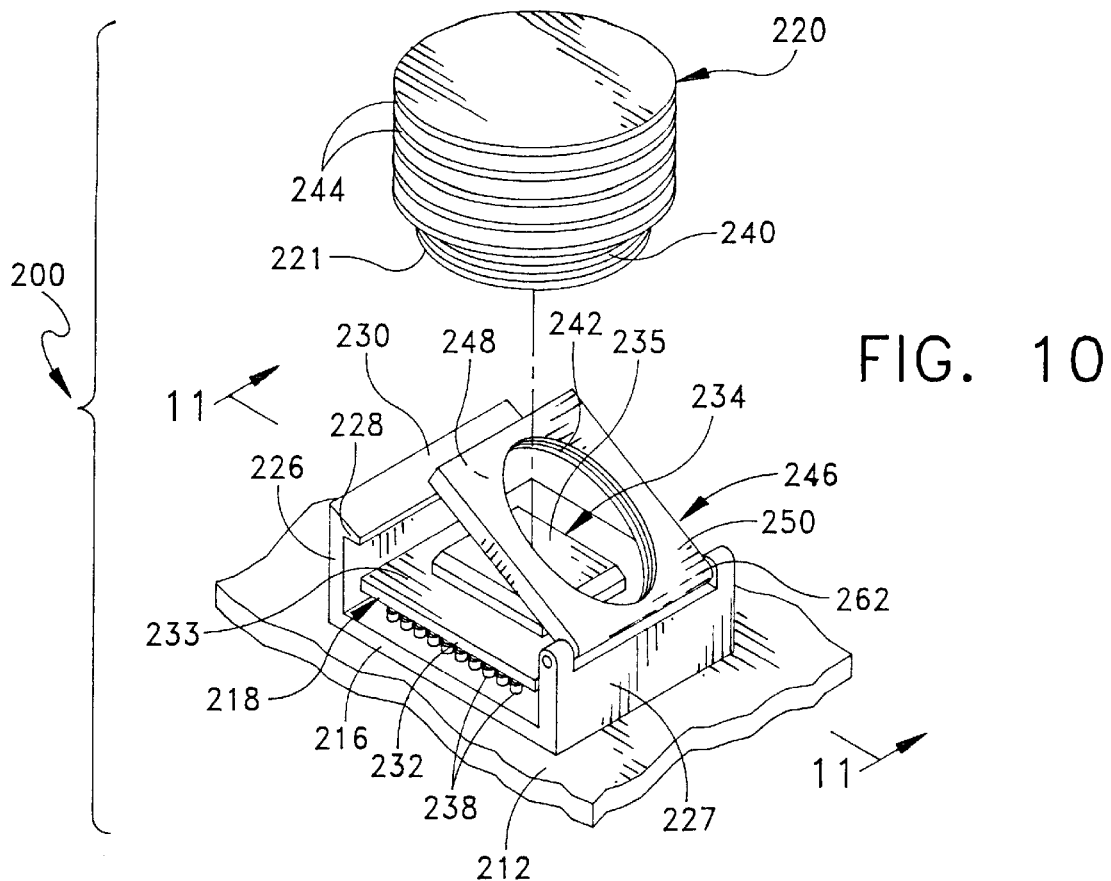
FIG. 10 is a partially assembled perspective view of the alternative embodiment of the present invention.
Figure 11:
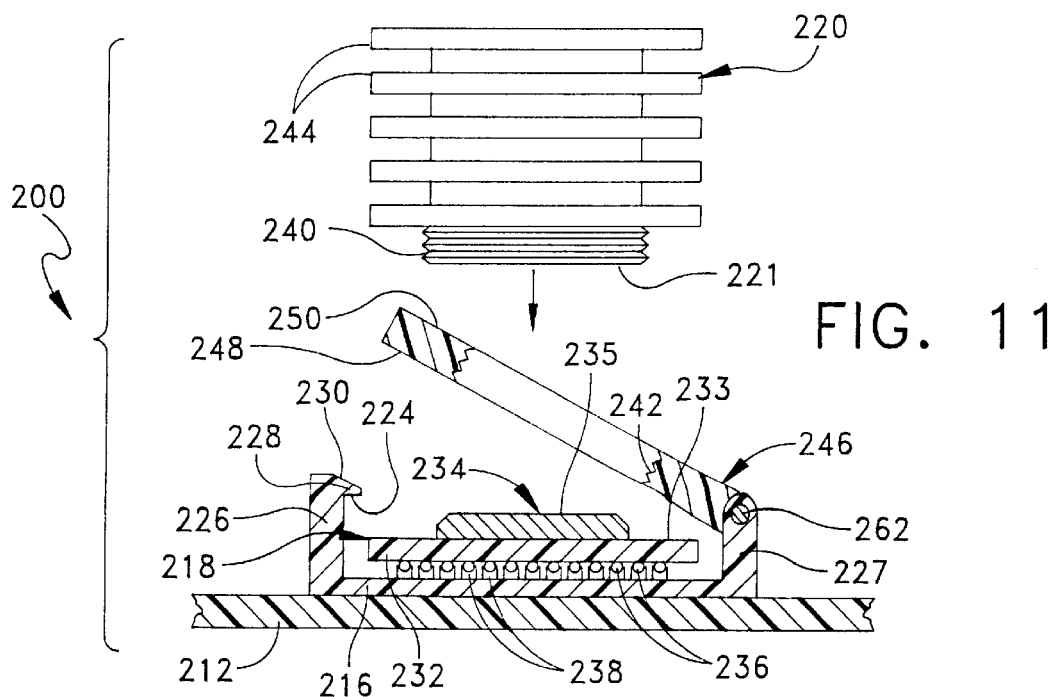
FIG. 11 is a partial cross-sectional view through the line 11—11 of FIG. 10.

Referring now to FIGS. 10–17, an alternative embodiment of the present invention is shown. FIG. 10, a perspective view of the heat sink assembly 200, illustrates a socket 216 installed on a circuit board 212. The socket 216 receives a BGA semiconductor device package 218. As also seen in FIG. 11, seats 238 are provided on socket 216 to receive the ball contacts 236 of BGA semiconductor device package 218. P referably integrated with socket 216 is an upstanding wall 226 with an inwardly t turned flange 228 with a bottom surface 224 and upper angled surface 230. On the opposite side of socket 216 is positioned an upstanding post 227 with a hinge 262 a t its upper free end. Top cover plate 246 is hingedly connected to upstanding post 227 via hinge 262. Top cover plate 246 provides female threaded bore 242 to receive male threaded base of heat dissipating member 220.

Figure 12:
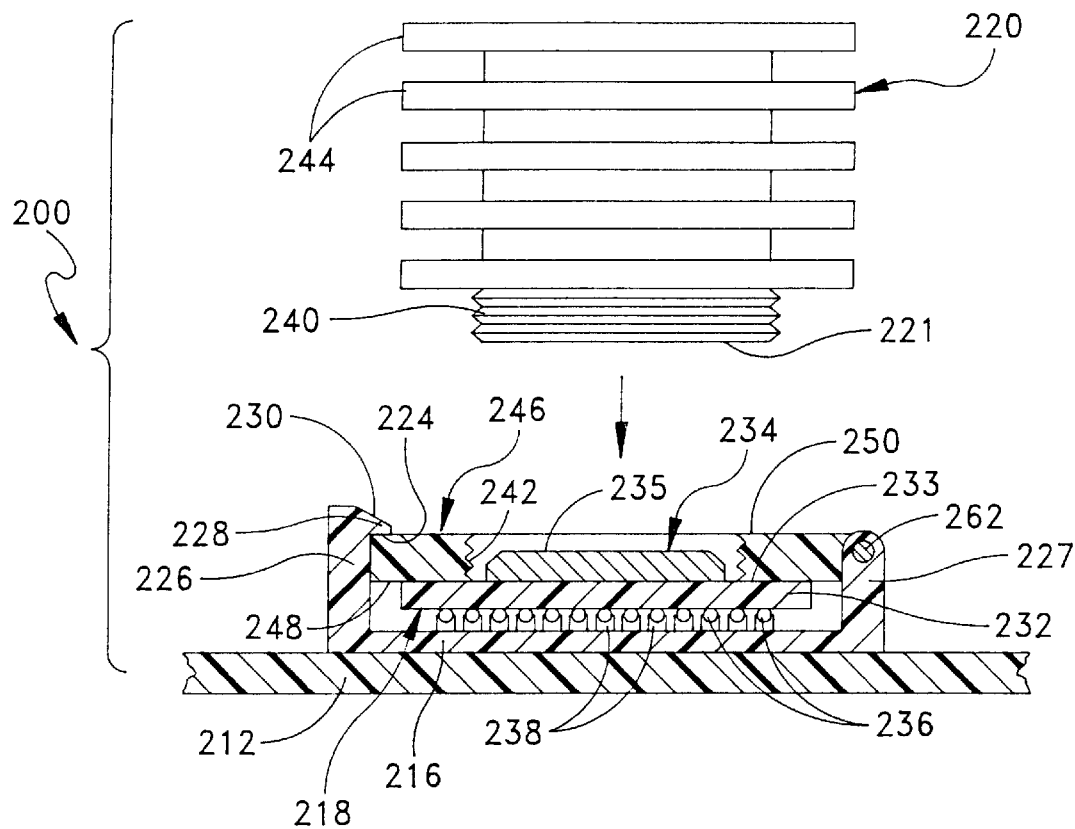
FIG. 12 is the cross-sectional view of FIG. 11 with hinged top cover plate in a closed position.
Figure 13:
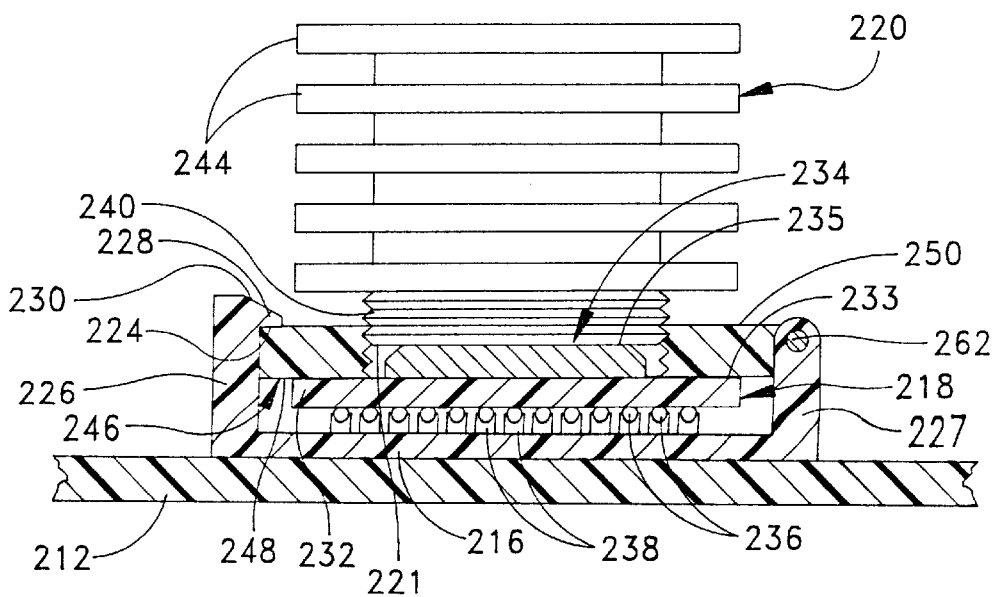
FIG. 13 is the cross-sectional view of FIG. 11 in a fully assembled condition.

Turning now to FIGS. 12 and 13, the assembly of the heat sink assembly 200 is shown. In FIG. 12, BGA semiconductor device package 218 is installed its socket 216 with solder balls 236 engaging with seats 238. Hinged top cover plate 246 is pivoted about hinge 262 to bear against angled surface 230 of flange 228 to snap into place without use of tools. In particular, top cover plate 246 is retained in place so that the bottom surface 248 of top cover plate is in communication with the top surface 233 of ceramic portion 132. The bottom surface 224 of flange is in contact with top surface 250 of top cover plate 246 to retain it in place. Slight outward bending of wall 226 will release hinged top cover plate 246 to allow access to BGA semiconductor device package 218 for replacement, repair, and the like.

In similar fashion to the preferred embodiment of the present invention, heat dissipating member 220 is threaded into female threaded aperture 242 for thermal communication with silicon portion 234 of BGA semiconductor device package 218. In particular, bottom surface 221 of heat dissipating member 220 communicates with top surface 235 of silicon portion 234. The independent adjustment of heat dissipating member 220 permits the application of different levels of pressure to the ceramic portion 232 and silicon portion 234, respectively.

Figure 14:
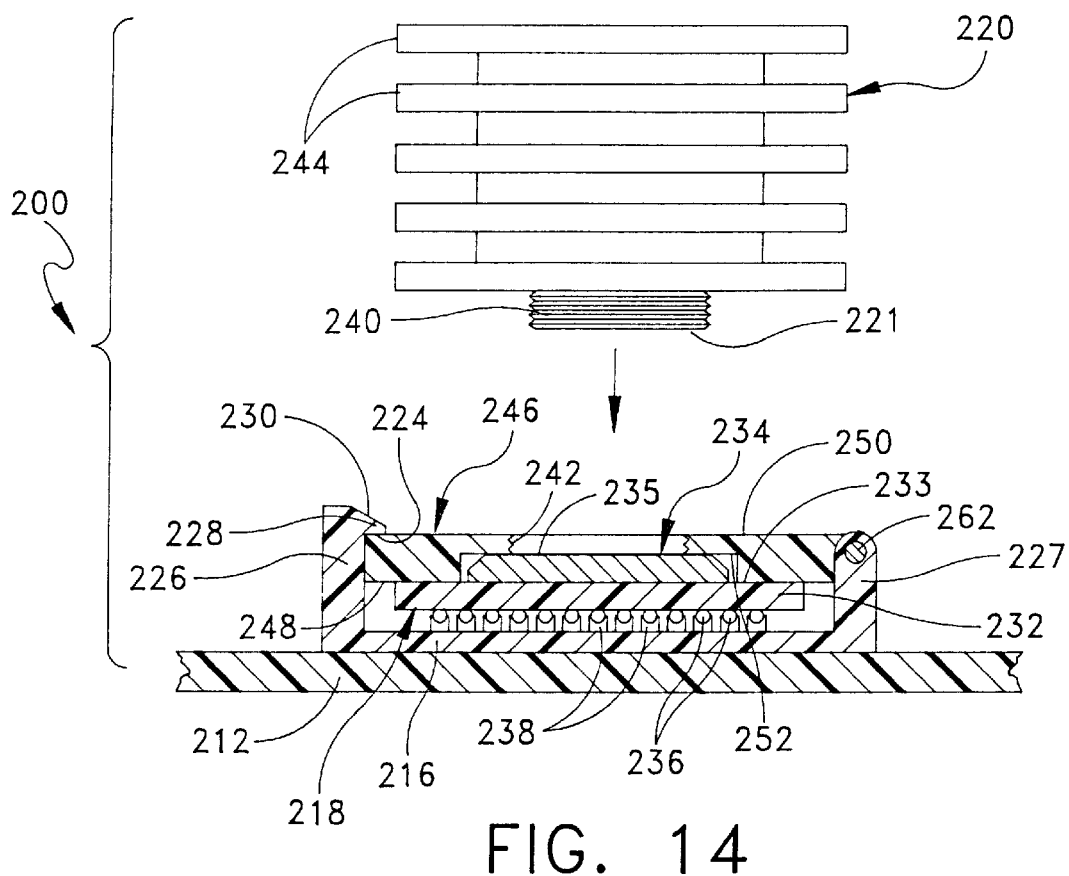
FIG. 14 is a partially assembled perspective view of the alternative embodiment of FIG. 10 with a modified hinged top cover plate.
Figure 15:
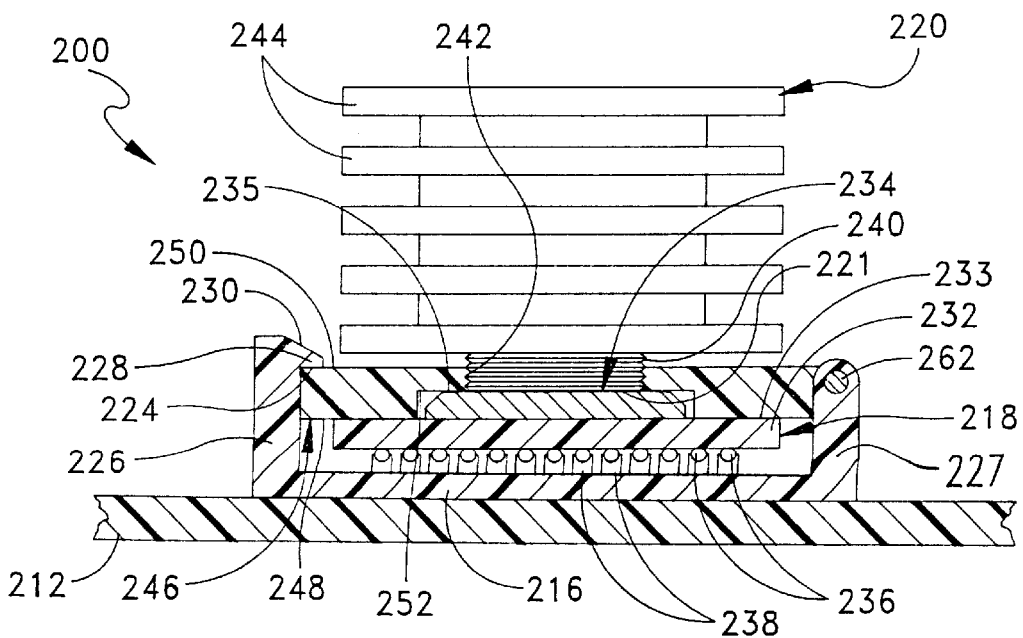
FIG. 15 is a partially assembled perspective view of the alternative embodiment of FIG. 14 in a fully assembled condition.

Referring to FIGS. 14 and 15, the alternative embodiment 200 of the present invention is shown to include a modified hinges top cover plate 246. The heat sink assembly 200 of FIGS. 14 and 15 includes heat dissipating member 220 with radiating fins 244 and male threaded shank 240 which threadably engages with female threaded aperture 242. In contrast to the alternative embodiment shown in FIG. 10, the heat sink assembly of FIGS. 14 and 15 provides a seat 252 under the bottom surface of top cover plate 246 to receive and protect silicon portion 234 of BGA device 218. FIGS. 14 and 15 illustrate the multiple pressure capability of the present invention with the further employment of a thicker top cover plate 246 to further enable the use of a stronger top cover plate, for example. The heat sink assembly of FIGS. 14 and 15 further illustrates the flexibility of the assembly of the present invention to accommodate a wide range of semiconductor device packages and different socket configurations.

Figure 16:
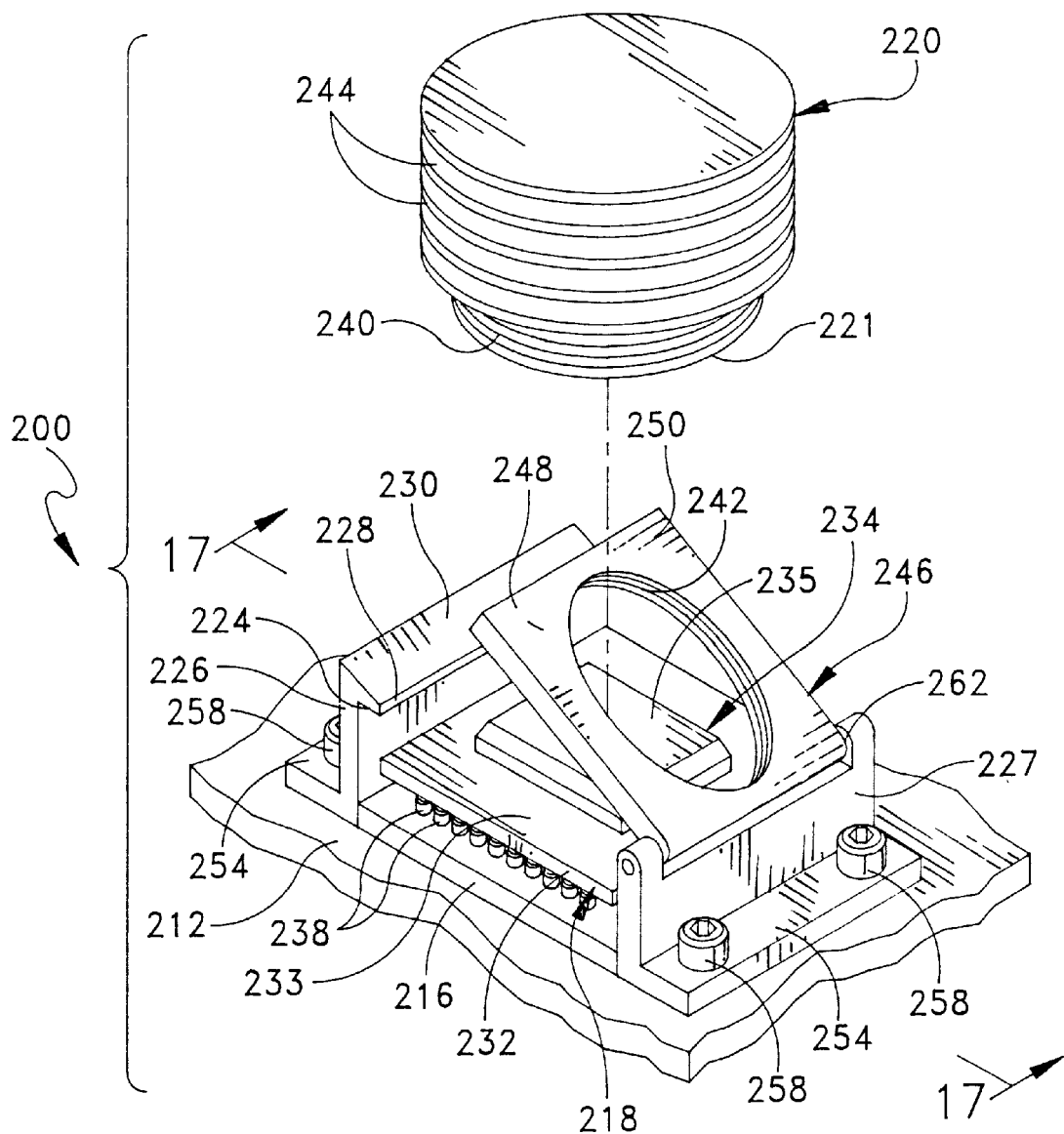
FIG. 16 is a partially assembled perspective view of the alternative embodiment of FIG. 10 with legs mounted directly to the circuit board.
Figure 17:
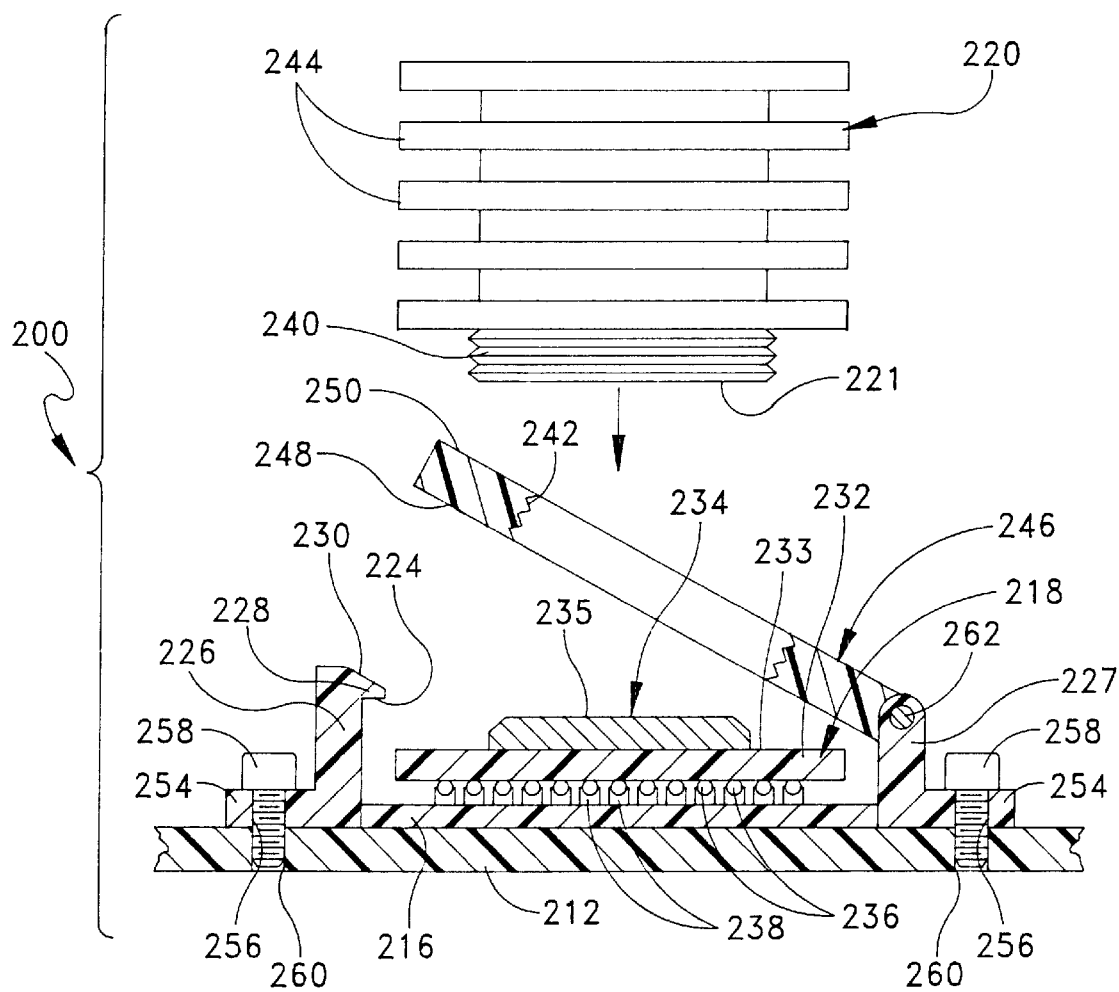
FIG. 17 is a cross-sectional view through the line 17—17 of FIG. 16.

Referring now to FIG. 16 and 17, the alternative embodiment of is shown with a slightly modified socket 216 and circuit board 212 arrangement to illustrate the flexibility of mounting of the alternative embodiment of the present invention. Leg 226 and post 227 are independent upstanding members which are separate from socket 216 and are connected independently to circuit board 212. Fasteners 258 are routed through apertures 256 in a corresponding base 254 for connection to circuit board 212, namely receipt of fastener 256 by a corresponding female threaded aperture 260. The foregoing illustrates that the particular configuration of the socket and circuit board is of little consequence as long as BGA device 218 is sandwiched between contact array 238 and top cover plate 246.

It is preferred that the top cover plates 146 and 246 be manufactured of plastic material, such as a high temperature resistant and high creep resistant plastic for better withstanding the high temperatures associated with microprocessors. For example, the plastic material for top cover plates 146 and 246 may be LNP VERTON UF-700-10-HS (P.P.A. 50% long fiber) for use in high temperate heat sink applications. In addition, heat dissipating members 120 and 220 are preferably metal, such as aluminum, for optimum thermal transfer and dissipation of heat from semiconductor device packages 118 and 218. Radial fins 144 and 244 are provided but various other heat sink fin configurations, such as a pin grid array, may be employed.

It should be understood that various types of threads are envisioned within the scope of the present invention. These various thread designs include continuous threads about the base of a heat dissipating member which have many turns. It is preferred that there be at least more than one turn to facilitate the adjustment of pressure to the silicon portion of the BGA device. However, a single turn 360° thread, as well as half and quarter turn thread are considered to be within the scope of the present invention due to the ability to impart any desired pressure to the silicon portion of the BGA device from the rotation of the heat dissipating member. Further, bayonet-type bases of the heat dissipating member which engage with ramped notches within the bore through the top cover plate are also considered to be threads which can provide a gradual, hand-controllable pressure to the silicon portion of the BGA device package.

The present invention illustrates two levels of pressure, one provided by the top cover plate and the second provided by the threadable engagement of the heat dissipating member into the female-threaded bore. Third and fourth pressures may also be applied to accommodate the specific needs of a wide array of types of semiconductor device packages. Additional top cover plates may be provided along with additional threaded heat dissipating members to accommodate such device packages.

It would be appreciated by those skilled in the art that various changes and modifications can be made to the illustrated embodiments without departing from the spirit of the present invention. All such modifications and changes are intended to be covered by the appended claims.

What is claimed is:

1. A heat dissipating device for removing heat from an electronic device package, comprising:
   a semiconductor socket;
   a pair of upstanding legs secured on opposing sides of said semiconductor socket; said pair of upstanding legs each including an inwardly turned flange;
   a semiconductor package installed in said socket; said semiconductor package having a lower surface with electrical contacts thereon; said electrical contacts being in electrical communication with said semiconductor socket; said semiconductor package including an outer peripheral region defining a first thickness of said semiconductor package and a first upper surface and an inner pad region defining a second thickness of said semiconductor package, which is larger than said first thickness, and a second upper surface;
   a top cover member with a peripheral edge and a bottom surface; said top cover member defining a female threaded bore therethrough; said bottom surface of said top cover member being in communication with said first upper surface of said semiconductor package at said outer peripheral region; said inwardly turned flanges communicating with respective opposing marginal portions of said top cover member proximal to said peripheral edge; said inwardly turned flanges defining an outer peripheral region pressure to be imparted on said first upper surface of said semiconductor package by said bottom surface of said top cover member;

a heat dissipating member having a threaded base portion with a substantially flat bottom surface adapted to be threadably received in said female threaded bore through said top cover member so that said flat bottom surface of said heat dissipating member is in flush thermal communication with said second upper surface of said semiconductor package at said inner pad region; said heat dissipating member, and threaded routing into said threaded bore, defining an inner pad region pressure onto said second surface of said semiconductor package;

whereby said outer peripheral region pressure and said inner pad region pressure are independently selectable to enable different pressures to be applied to said first upper surface of said semiconductor package and said second upper surface of said semiconductor package, respectively.

2. The heat dissipating device of claim 1, wherein said inner pad region pressure applied to said first upper surface of said semiconductor package is less than said outer peripheral region pressure applied to said second upper surface of said semiconductor package.

3. The heat dissipating device of claim 1, further comprising:

a circuit board; said semiconductor socket being installed in said circuit board.

4. The heat dissipating device of claim 1, wherein said heat dissipating member includes a plurality of fin members.

5. The heat dissipating device of claim 1, wherein said top cover member is made of plastic.

6. The heat dissipating device of claim 1, further comprising:

a seat extending upwardly from said bottom surface of said top cover member a distance at least as much as said second thickness of said semiconductor package to accommodate said inner pad region of said semiconductor package therein.

7. The heat dissipating device of claim 1, wherein said outer peripheral region pressure applied to said second upper surface of said semiconductor package is preset.

8. A heat dissipating device for removing heat from an electronic device package, comprising:

a semiconductor socket;

a semiconductor package installed in said socket; said semiconductor package having a lower surface with electrical contacts thereon; said electrical contacts being in electrical communication with said semiconductor socket; said semiconductor package including an outer peripheral region defining a first thickness of said semiconductor package and a first upper surface and an inner pad region defining a second thickness of said semiconductor package, which is larger than said first thickness, and a second upper surface;

an upstanding wall disposed proximal to said semiconductor package and secured relative thereto;

an inwardly turned flange positioned at a top free end of said upstanding wall;

an upstanding post disposed proximal to said semiconductor package and secured relative thereto; said upstanding post being positioned on an opposite side of said semiconductor package relative to said upstanding wall;

a top cover member with a first peripheral edge, a second peripheral edge opposite from said first peripheral edge and a bottom surface; said top cover member defining a female threaded bore therethrough; said top cover member being hingedly connected at its second peripheral edge to an upper free end of said upstanding post; said top cover member being snappingly engageable with said inwardly turned flange at its first peripheral edge; said bottom surface of said top cover member being in communication with said first upper surface of said semiconductor package at said outer peripheral region; engagement of said top cover member with said outer peripheral region of said semiconductor package defining a preset outer peripheral region pressure to be imparted on said first upper surface of said semiconductor package by said bottom surface of said top cover member;

a heat dissipating member having a threaded base portion with a substantially flat bottom surface adapted to be threadably received in said female threaded bore through said top cover member so that said flat bottom surface of said heat dissipating member is in flush thermal communication with said second upper surface of said semiconductor package at said inner pad region; said heat dissipating member, and threaded routing into said threaded bore, defining an inner pad region pressure onto said second surface of said semiconductor package;

whereby said outer peripheral region pressure and said inner pad region pressure are independently adjustable to enable different pressures to be applied to said first upper surface of said semiconductor package and said second upper surface of said semiconductor package, respectively.

9. The heat dissipating device of claim 8, wherein said inner pad region pressure applied to said first upper surface of said semiconductor package is less than said outer peripheral region pressure applied to said second upper surface of said semiconductor package.

10. The heat dissipating device of claim 8, further comprising:

a circuit board; said semiconductor socket being installed in said circuit board.

11. The heat dissipating device of claim 8, wherein said heat dissipating member includes a plurality of fin members.

12. The heat dissipating device of claim 8, wherein said top cover member is made of plastic.

13. The heat dissipating device of claim 8, further comprising:

a seat extending upwardly from said bottom surface of said top cover member a distance at least as much as said second thickness of said semiconductor package to accommodate said inner pad region of said semiconductor package therein.

* * * * *